(12) United States Patent
Huffman et al.

(10) Patent No.: US 9,374,900 B2
(45) Date of Patent: Jun. 21, 2016

(54) TWO-PIECE UNMATE-ASSIST STANDOFF

(71) Applicant: Samtec, Inc., New Albany, IN (US)

(72) Inventors: James Robert Huffman, Lanesville, IN (US); Cody Logan Graf, Sellersburg, IN (US); David Lynn Decker, Jeffersonville, IN (US); William Chieng Ouyang, New Albany, IN (US)

(73) Assignee: Samtec, Inc., New Albany, IN (US)

( * ) Notice: Subject to any disclaimer, the term of this patent is extended or adjusted under 35 U.S.C. 154(b) by 0 days.

(21) Appl. No.: 14/542,857

(22) Filed: Nov. 17, 2014

(65) Prior Publication Data

US 2015/0146400 A1 May 28, 2015

Related U.S. Application Data

(60) Provisional application No. 61/907,952, filed on Nov. 22, 2013.

(51) Int. Cl.
*H05K 1/14* (2006.01)
*F16B 5/02* (2006.01)

(52) U.S. Cl.
CPC .............. *H05K 1/144* (2013.01); *F16B 5/0233* (2013.01); *H05K 2201/042* (2013.01); *H05K 2201/10409* (2013.01); *H05K 2201/2036* (2013.01); *Y10T 403/56* (2015.01)

(58) Field of Classification Search
CPC ...... H01R 12/62; H01R 24/68; H01R 12/737; H01R 12/79; H01R 13/627
See application file for complete search history.

(56) References Cited

U.S. PATENT DOCUMENTS

| | | | | |
|---|---|---|---|---|
| 5,166,862 A * | 11/1992 | Durivage, III | ....... | H01H 71/123 361/676 |
| 6,280,202 B1 * | 8/2001 | Alden, III | .............. | H05K 7/142 174/138 D |
| 6,431,879 B2 * | 8/2002 | Brekosky | ....................... | 361/804 |
| 6,469,905 B1 * | 10/2002 | Hwang | ................ | G02B 6/4277 361/741 |
| 6,692,310 B2 * | 2/2004 | Zaderej | ................ | H01R 13/514 439/541.5 |
| 6,712,544 B2 * | 3/2004 | Kruger | .................. | F16B 5/0233 403/370 |
| 7,086,896 B2 * | 8/2006 | Edwards | ................ | H05K 7/142 439/573 |
| 7,448,879 B2 * | 11/2008 | Jin | ..................... | H01R 12/7076 439/331 |
| 7,576,552 B2 * | 8/2009 | Sheeran | .............. | G01R 31/046 324/756.02 |

(Continued)

FOREIGN PATENT DOCUMENTS

KR   20-0324629 Y1   8/2003

OTHER PUBLICATIONS

Official Communication issued in corresponding International Application PCT/US2014/065908, mailed on Feb. 27, 2015.

*Primary Examiner* — Truc Nguyen
(74) *Attorney, Agent, or Firm* — Keating & Bennett, LLP

(57) ABSTRACT

A connector system includes a first substrate, a second substrate, and a standoff arranged between the first substrate and the second substrate. The standoff includes a first part with an external threading and a second part with an internal threading configured to engage with the external threading of the first part. The first part is configured to engage with the first substrate, the second part is configured to engage with the second substrate, and the external threading of the first part and the internal threading of the second part are configured such that the first part and the second part are configured to be unscrewed from each other to cause the distance between the first and second substrates to increase.

21 Claims, 23 Drawing Sheets

(56) References Cited

U.S. PATENT DOCUMENTS

| | | | |
|---|---|---|---|
| 7,614,602 B2 | 11/2009 | Hutter, III | |
| 7,654,863 B2 * | 2/2010 | Fan | H05K 7/1007 439/159 |
| 7,819,693 B2 * | 10/2010 | Polnyi | H05K 7/1061 439/331 |
| 2008/0146092 A1 | 6/2008 | Taylor et al. | |
| 2010/0093193 A1 | 4/2010 | Trout et al. | |

* cited by examiner

FIG. 5A  FIG. 5B  FIG. 5C  FIG. 5D
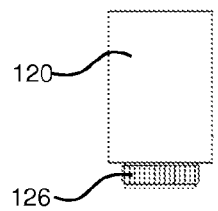
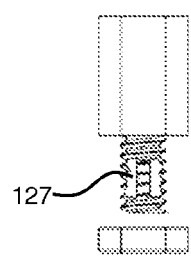
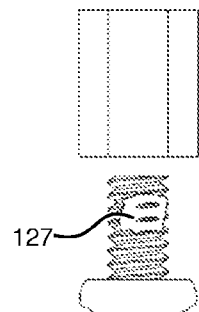
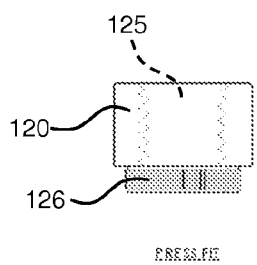
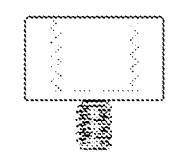
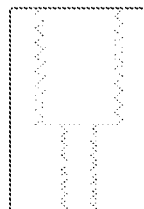
PRESS FIT    SOLDER    MALE THREAD-VERTICAL    FEMALE THREAD
FIG. 6A
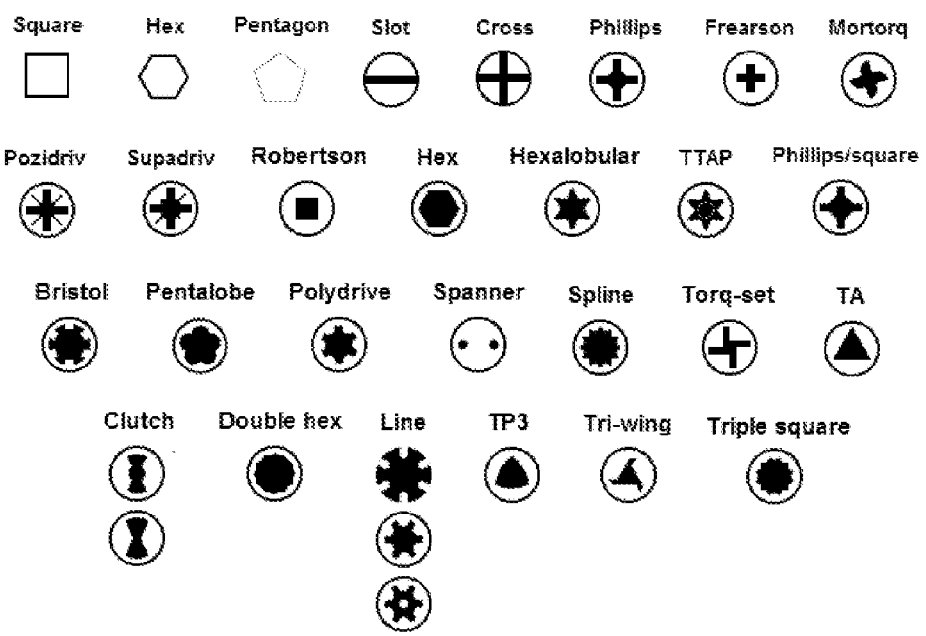

FIG. 6B   FIG. 6C   FIG. 6D   FIG. 6E
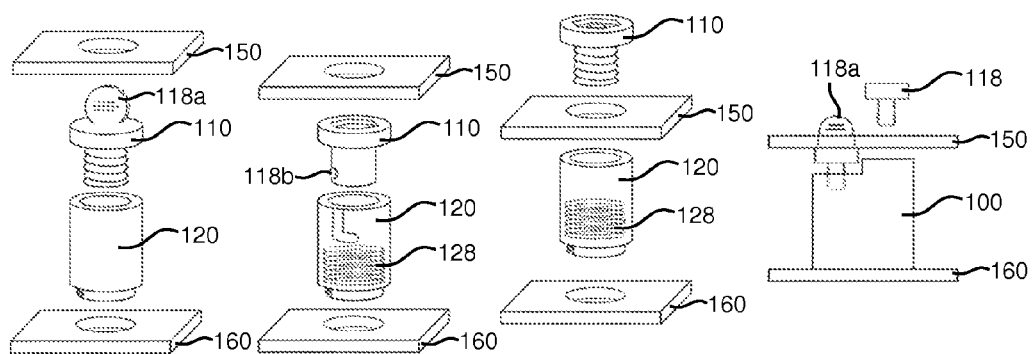
FIG. 7A   FIG. 7B   FIG. 7C
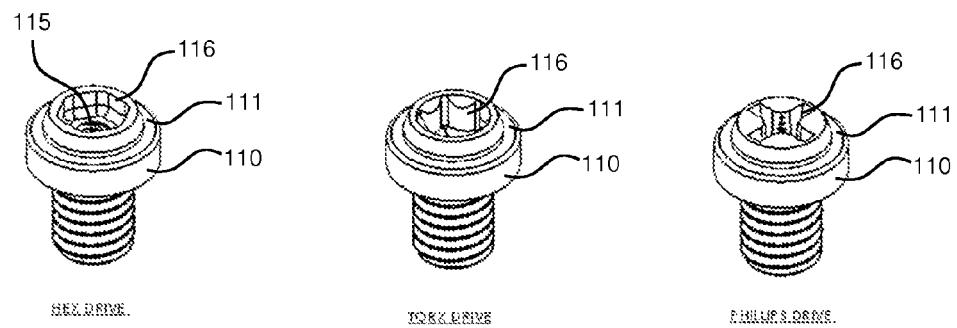

TWO-PIECE UNMATE-ASSIST STANDOFF

BACKGROUND OF THE INVENTION

1. Field of the Invention

The present invention relates to standoffs for substrates such as printed circuit boards. More specifically, the present invention relates to standoffs that can be used to unmate substrates.

2. Description of the Related Art

One known method for mating two substrates together is to use pairs of board-to-board connectors. FIG. 24 shows a first substrate 1050 with eight male connectors 1030, and FIG. 25 shows a second substrate 1060 with eight corresponding female connectors 1040. FIGS. 26 and 27 show the first and second substrates 1050 and 1060 connected to together. FIG. 27 also includes a partial cross-section of a male connector 1030 and a female connector 1040, showing that the contacts 1031 of the male connector 1030 and the contacts 1041 of the female connector 1040 are aligned along a centerline C.

However, mating and unmating the first and second substrates 1050 and 1060 from each other can cause problems, including damaging the plastic connector bodies of the male and female connectors 1030 and 1040, damaging the contacts 1031 and 1041 of the male and female connectors 1030 and 1040, fracturing solder joints, damaging the first and second substrates 1050 and 1060, injuring the hands of the person attempting to unmate the first and second substrates 1050 and 1060, and cracking traces included in or on the first and second substrates 1050 and 1060 by overstressing or over bending the first and second substrates 1050 and 1060 while unmating the male and female connectors 1030 and 1040. Further, during mating and unmating of the first and second substrates 1050 and 1060 from each other, plastic may be shaved off from the inner walls of the connector bodies of the male and female connectors 1030 and 1040, which can then move into critical contact areas. For example, during subsequent matings, the plastic shavings can become lodged between the contacts 1031 and 1041 of the connectors 1030 and 1040, thereby preventing an electrical connection between the first and second substrates 1050 and 1060.

Zipper mating and unmating methods have typically been used to mate and unmate substrates. The zipper mating method involves applying pressure to one side of one or both of the substrates, which causes the substrates to be angled, and not parallel, with respect to each other. The zipper unmating method, applied to the first and second substrates 1050 and 1060, is shown in FIG. 28. As shown in FIG. 28, the right side of the first substrate 1050 is lifted from the second substrate 1060, such that the male connectors 1030 begin to unevenly disengage from the female connectors 1040. Various tools, such as a screwdriver or a user's fingers, have typically been used to pry the substrates 1050 and 1060 apart. Custom unmating tools have also been used to unmate substrates, although such custom tools generally require large keepout areas on the substrates, reducing the area on the substrates for electrical traces and connectors. Pneumatic presses, which require additional cost and inconvenience, have also been used to unmate substrates. However, custom tools or pneumatic presses may still result in uneven unmating of the substrates 1050 and 1060.

Unmating the male connectors 1030 and the female connectors 1040 at an angle as shown in FIG. 28 can result in damage to the substrates 1050 and 1060 and the electrical connectors 1030 and 1040. For example, as shown in FIG. 29, repeated zipper mating and unmating can result in the contacts 1041 of the female connector 1040 deforming and not aligning with the corresponding contacts 1031 of the male connector 1030 along the centerline C, which can cause stubbing or mis-mating. For example, the contacts 1041 of the female connector 1040 can be deformed so that they are offset from the corresponding contacts 1031 of the male connector 1030, and thus causing the contacts 1041 of the female connector 1040 to mate with the incorrect contacts 1031 of the male connector 1030.

It has also been known to use standoffs or substrate spacers between mated substrates. However, when standoffs or substrate spacers are not used, incorrect board-to-board distances between the substrates can result, which can lead to insufficient contact wipe for corresponding connectors mounted on the substrates. Contact wipe is defined as the distance a contact rubs against the surface of its corresponding mating contact during mating and unmating. Insufficient contact wipe can lead to a poor electrical connection. For example, as shown in FIG. 26, the lack of any spacers between the substrates 1050 and 1060 can result in an insufficient contact wipe between the contacts 1031 of the male connector 1030 and the contacts 1041 of the female connector 1040.

Moreover, failure to use standoffs or substrate spacers can lead to additional problems, such as fretting corrosion in the contact area and fractured solder joints when the mated substrates 1050 and 1060 are exposed to vibrations or harsh environments.

SUMMARY OF THE INVENTION

To overcome the problems described above, preferred embodiments of the present invention provide a two-piece standoff that can assist in unmating two substrates.

A connector system according to a preferred embodiment of the present invention includes a first substrate, a second substrate, and a standoff arranged between the first substrate and the second substrate. The standoff includes a first part with an external threading and a second part with an internal threading configured to engage with the external threading of the first part. The first part is configured to engage with the first substrate, the second part is configured to engage with the second substrate, and the external threading of the first part and the internal threading of the second part are configured such that the first part and the second part are configured to be unscrewed from each other to cause the distance between the first and second substrates to increase.

Preferably, the connector system further includes a screw, the first part includes an internal threading, the first substrate includes a hole, and the screw extends from an exterior surface of the first substrate and into the hole of the first substrate to engage the internal threading of the first part to secure the standoff to the first substrate. A washer is preferably arranged between the head of the screw and the exterior surface of the first substrate. Preferably, a distance between the first and second substrates decreases when the screw is screwed into the internal threading of the first part.

A height of the standoff preferably increases when the first part and the second part are unscrewed from each other. Preferably, a shoulder portion of the first part is arranged at an interior surface of the first substrate, and, when the first part and the second part are unscrewed from each other, the shoulder portion presses against the first substrate to increase the distance between the first and second substrates. The height of the standoff preferably decreases when the first part is screwed into the second part.

Preferably, the second part includes a knurled portion, the second substrate includes a hole, and the knurled portion of the second part is press-fit into the hole of the second substrate to secure the standoff to the second substrate.

The second part is preferably soldered to the second substrate to secure the standoff to the second substrate.

Preferably, the second part includes an external threading, the second substrate includes a hole, and the external threading of the second part is arranged to pass through a hole in the second substrate. The standoff is preferably secured to the second substrate by attaching a nut to the external threading of the second part. The standoff is preferably configured to be secured to the second substrate by engaging the external threading of the second part with an internal threading of a first part of another standoff.

Preferably, the second part includes an internal threading, the second substrate includes a hole, and a screw inserted into the hole of the second substrate engages with the internal threading of the second part to secure the standoff to the second substrate.

Preferably, a first electrical connector is arranged on the first substrate, a second electrical connector is arranged on the second substrate, and, when the first and second parts are mated with each other and engaged with the first and second substrates, the first electrical connector is mated with the second electrical connector.

Preferably, a first electrical connector is arranged on the first substrate, a second electrical connector is arranged on the second substrate, and, when the first and second parts are unmated from each other, the first electrical connector is unmated from the second electrical connector.

Preferably, the first part includes a recess, and the recess is arranged to receive a tool to rotate the first part with respect to the second part. The recess is preferably arranged to receive one of an Allen wrench, a hex drive, a star drive, and a Philips drive.

The first and second substrates are preferably parallel or substantially parallel, perpendicular or substantially perpendicular, or coplanar or substantially coplanar with respect to each other. Preferably, the second part includes a pivot point configured to position the first and second substrates at an oblique angle with respect to each other The above and other features, elements, steps, configurations, characteristics, and advantages of the present invention will become more apparent from the following detailed description of preferred embodiments of the present invention with reference to the attached drawings.

BRIEF DESCRIPTION OF THE DRAWINGS

FIGS. 5A to 5D show various attachment types for the bottom part of the standoff shown in FIG. 1.

FIG. 6A shows various drive types for the screw of the standoff shown in FIG. 1.

FIGS. 6B to 6E show various locking mechanisms for the top part of the standoff shown in FIG. 1.

FIGS. 7A to 7C show various drive types for the top part of the standoff shown in FIG. 1.

DETAILED DESCRIPTION OF PREFERRED EMBODIMENTS

Preferred embodiments of the present invention will now be described in detail with reference to FIGS. 1 to 23. Note that the following description is in all aspects illustrative and not restrictive and should not be construed to restrict the applications or uses of the present invention in any manner.

Figure 1:
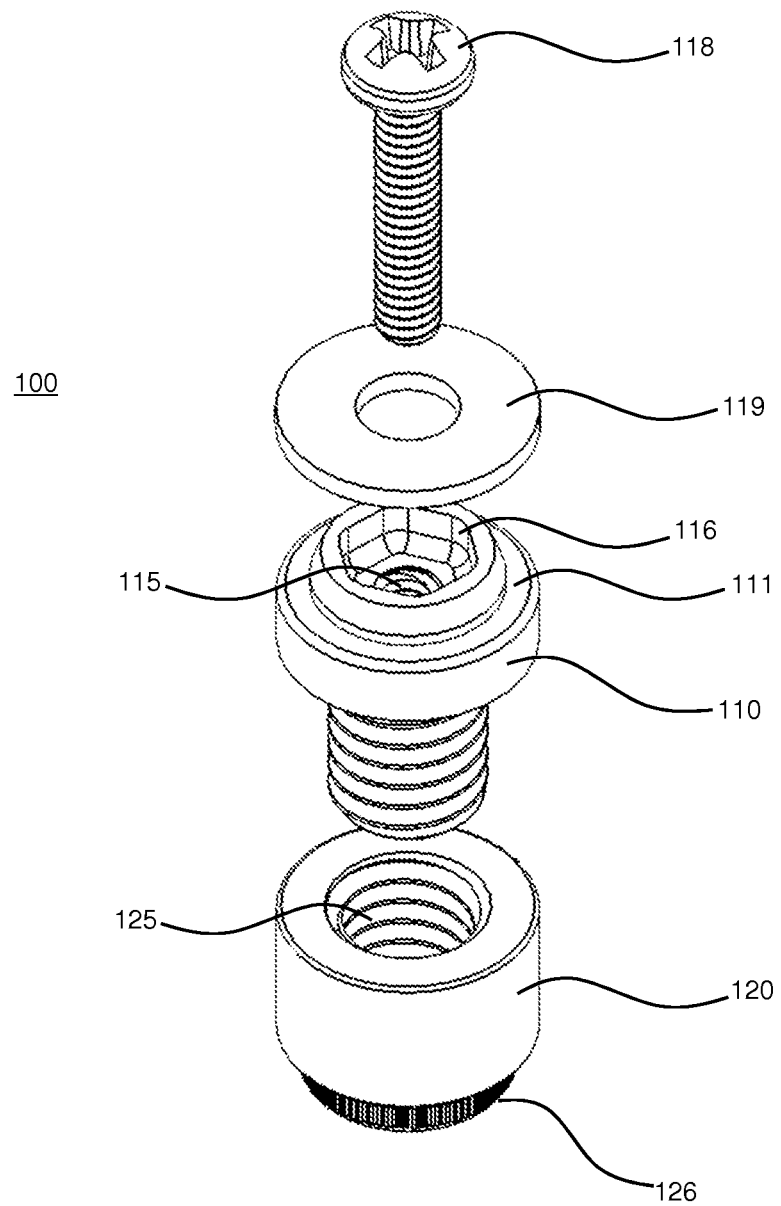
FIG. 1 is an exploded view of a standoff according to a first preferred embodiment of the present invention.
Figure 2:
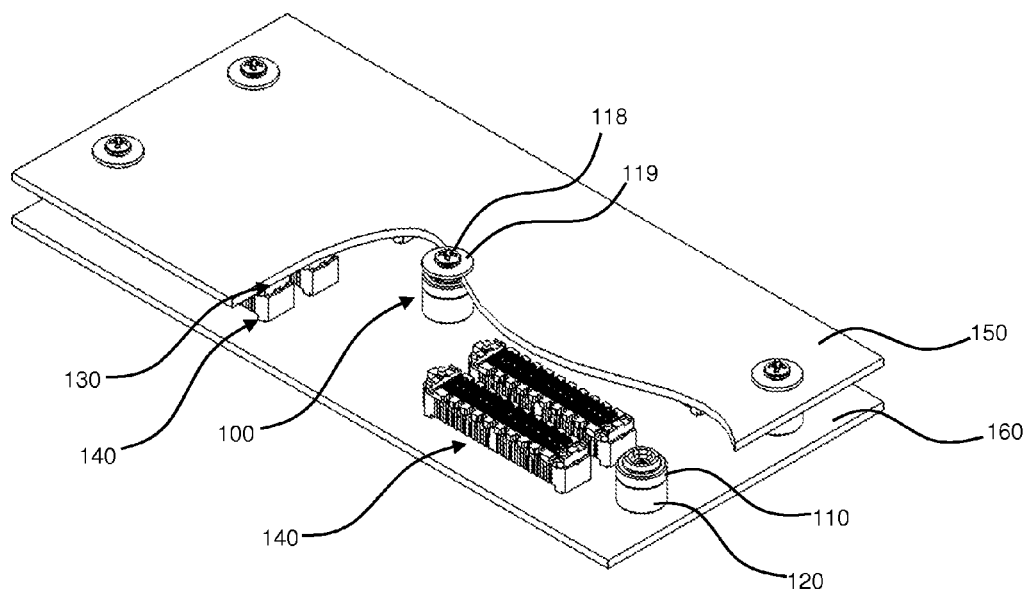
FIG. 2 shows a plurality of the standoffs shown in FIG. 1 arranged between two parallel or substantially parallel substrates with corresponding top and bottom connectors.
Figure 3:
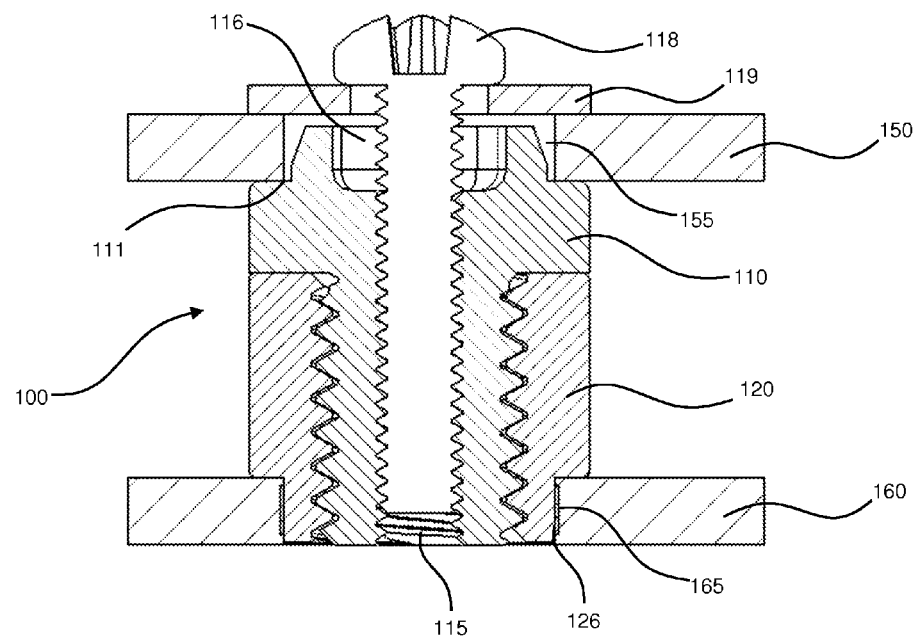
FIG. 3 is close-up sectional view of the standoff shown in FIG. 1.

FIG. 1 shows a standoff 100 according to a first preferred embodiment of the present invention. FIG. 2 shows a plurality of standoffs 100 arranged between two substrates 150 and 160 with corresponding top and bottom connectors 130 and 140 on the main surfaces of the substrates 150 and 160. The substrates 150 and 160 are parallel or substantially parallel, within manufacturing tolerances. FIG. 3 is close-up sectional view of the standoff 100 arranged between the substrates 150 and 160. FIGS. 4A to 4E are sectional views of the mating and unmating of the substrates 150 and 160 and the connectors 130 and 140 using the standoffs 100.

As shown in FIG. 1, the standoff 100 includes a top part 110 with an external threading that engages with an internal threading of a bottom part 120. The top part 110 includes a hole 115 with an internal threading that engages with the external threading on a screw 118. The screw 118 passes through the hole of a washer 119 when the screw 118 is engaged with the top part 110 such that the washer 119 is arranged between the head of the screw 118 and the top part 110. The top part 110 also includes a shoulder 111 and a recess 116 and the bottom part 120 also includes a knurled portion 126.

As shown in FIGS. 2 and 3, standoffs 100 may be arranged between a top substrate 150 and a bottom substrate 160. When the standoffs 100 are mounted to the substrates 150 and 160 and the top parts 110 of the standoffs 100 are all fully screwed into their corresponding bottom parts 120, the substrates 150 and 160 are arranged to be parallel or substantially parallel with each other. The top substrate 150 further includes top connectors 130 mounted thereon, and the bottom substrate 160 further includes bottom connectors 140 mounted thereon. Accordingly, when the top and bottom parts 110 and 120 of the standoffs 100 are fully engaged with each other, contacts included in the top and bottom connectors 130 and 140 engage with each other.

Figure 4A:
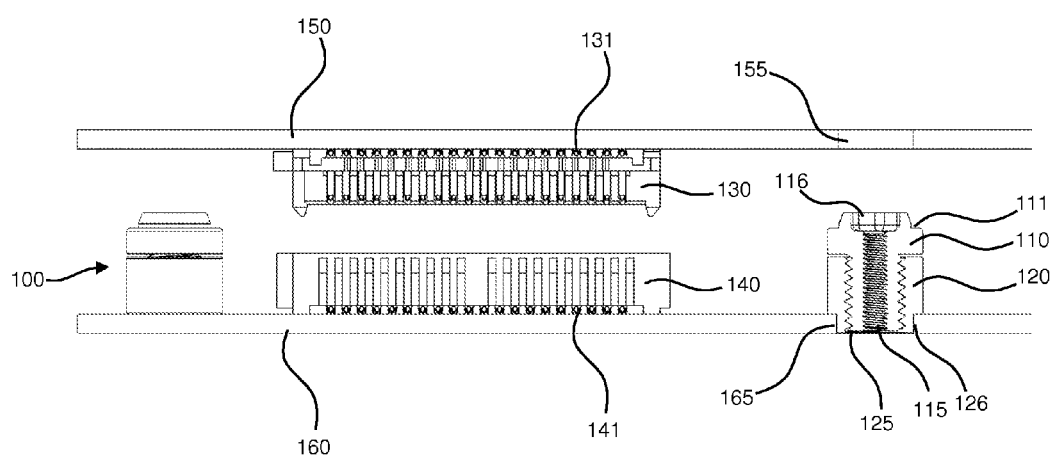
FIGS. 4A to 4E are sectional views of mating and unmating the substrates and connectors shown in FIG. 2.

FIGS. 4A to 4E are sectional views of the mating and unmating of the connectors 130 and 140 using the standoffs 100. As shown in FIG. 4A, the top and bottom parts 110 and 120 of the standoffs 100 are engaged with each other, and the knurled portion 126 of the bottom part 120 is press fit into a corresponding hole 165 in the bottom substrate 160. The bottom part 120 is thus fixed to the bottom substrate 160, and the top part 110 may rotate freely within the bottom part 120 to engage or disengage the top part 110 from the bottom part 120. However, the standoffs 100 can be connected to the bottom substrate 160 in any suitable manner that allows for the top part 110 of the standoff 100 to be disconnected from bottom part 120 of the standoff 100. For example, as shown in FIGS. 5A to 5D, the bottom part 120 of the standoff 100 can be connected to the bottom substrate 160 using (a) a press-fit with the knurled portion 126, (b) a solder connection, (c) a threaded male portion attached to the bottom substrate 160 using a nut, (d) a threaded female portion attached to the bottom substrate 160 using a screw, etc. If a threaded male or female portion is used for the bottom part 120 as shown in FIGS. 5C and 5D, a thread-locking fluid or paste 127 is preferably used to help secure the bottom part 120 to the button substrate 160, and a washer can be used in combination with the nut or screw to attach the bottom part 120 to the bottom substrate 160. Further, it is possible to use other arrangements, including having the top part 110 fixed and the bottom part 120 being rotatable with respect to the top part 110.

Figure 4B:
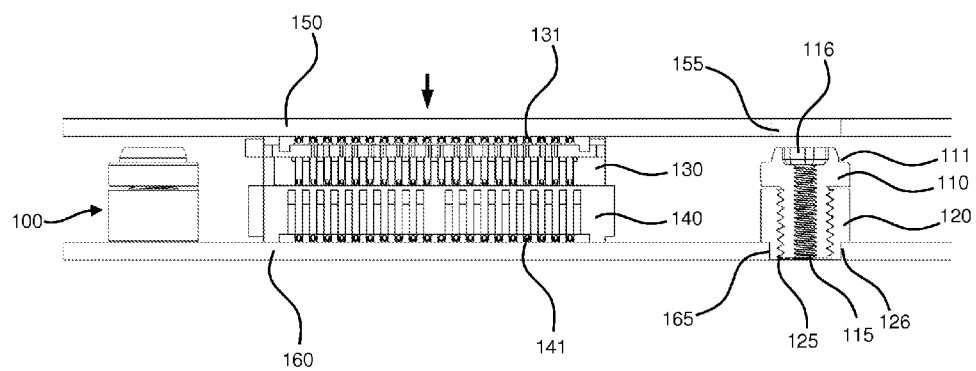
Figure 4C:
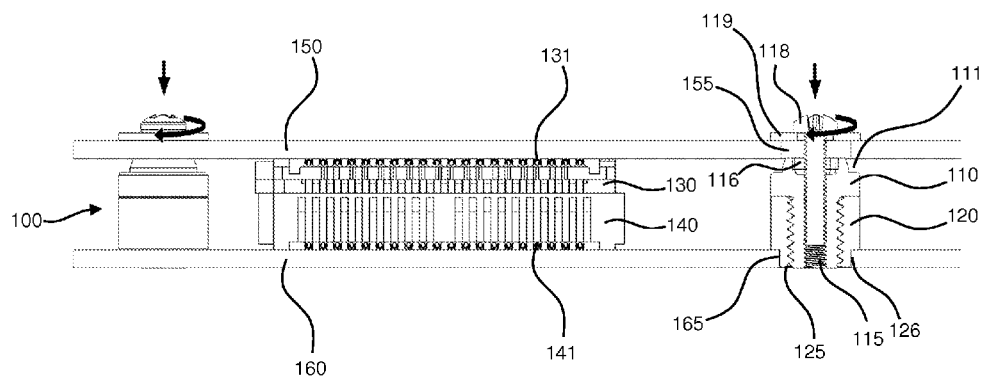

Next, as shown in FIG. 4B, the top and bottom connectors 130 and 140 are aligned with each other, preferably without engaging the contacts 131 and 141. The top part 110 of the standoff 100 is also aligned with a hole 155 in the top substrate 150, such that the shoulder 111 of the top part 110 is arranged to engage with the edge of the hole 155. As shown in FIG. 4C, the washer 119 is then arranged over the hole 155 in the top substrate 150, and the screw 118 is inserted through the washer 119 and into the hole 115 of the top part 110. The screw 118 engages with the internal threading of the hole 115, thereby drawing the substrates 150 and 160 closer together as the screw 118 is rotated and tightened due to the washer 119 pressing against the upper substrate 150. However, it is possible to use other arrangements, such as omitting the washer 119, and the screw 118 may have any drive type, for example, square, pentagon, slot, cross, Phillips, Frearson, JIS B 1012, Mortorq, Pozidriv, Supadriv, Robertson, star, etc., as shown in FIG. 6A. Further, any suitable locking mechanisms could be used in place of the screw 118 to connect the top part 110 of the standoff 100 to the top substrate 150, including snap-in design, quarter turn, lock/spring compression, cammed locks, wedge locks, thumb screw, reverse male/female threading, dovetail, wedge/grove, lock pin/cotter pin, starlock, wedgelock, retaining rings/slots, etc. For example, the screw 118 may be replaced by a thumb screw 118a as shown in FIG. 6B or a cammed lock 118b as shown in FIG. 6C. In addition, a spring 128 may be included in the bottom part 120 to aid in unmating the top and bottom substrates 150 and 160, as shown in FIGS. 6C and 6D. More than one locking mechanism may be used to connect the top part 110 to the top substrate 150, for example, both the screw 118 and the thumb screw 118a, as shown in FIG. 6E.

Figure 4D:
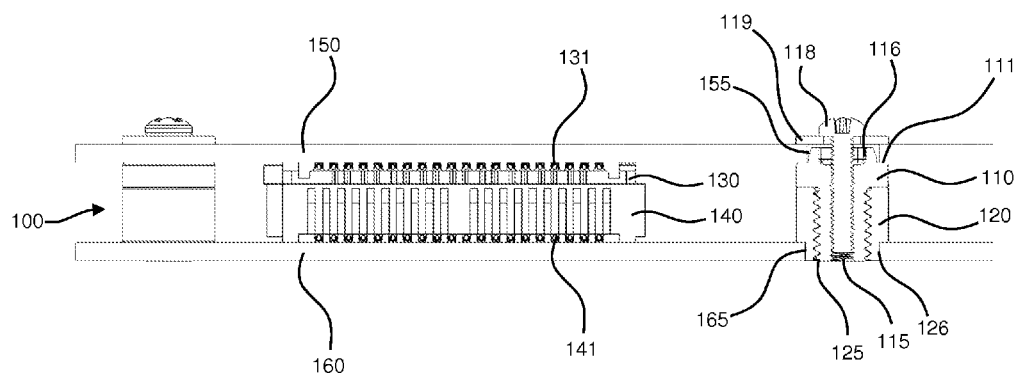

Preferably, the screws 118 of the different standoffs 100 between the substrates 150 and 160 are incrementally and sequentially screwed into the holes 115 of their corresponding top parts 110 of the different standoffs 100 so that the substrates 150 and 160 are maintained in a parallel or substantially parallel state. Accordingly, as the substrates 150 and 160 are drawn closer together, the contacts 131 and 141 maintain a vertical or substantially vertical alignment with respect to each other as they are fully mated, as shown in FIG. 4D.

Figure 4E:
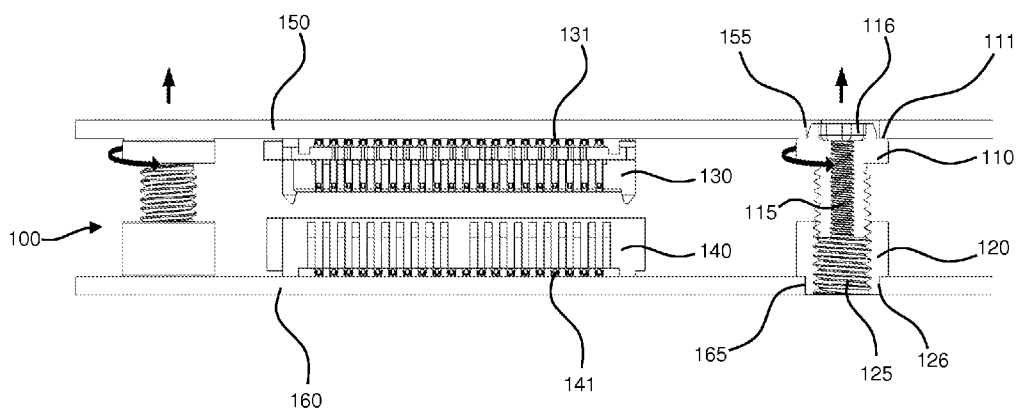
Figures 8A, 8B, 8C, 8D, 8E:
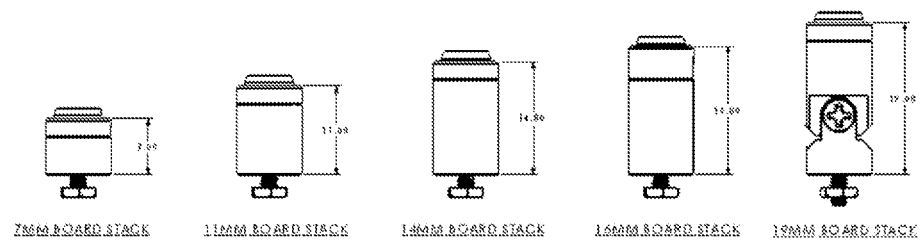
FIGS. 8A to 8E show different possible standoff stack heights that can be used with the standoff shown in FIG. 1.

To unmate the connectors 130 and 140 from each other, the screw 118 from each of the standoffs 100 is fully unscrewed from its corresponding top part 110, and the all of the screws 118 and washers 119 are removed, as shown in FIG. 4E. Preferably, the top parts 110 of different standoffs 100 between the substrates 150 and 160 are incrementally and sequentially unscrewed from the holes 125 of their corresponding bottom parts 120 so that the substrates 150 and 160 are maintained in a parallel or substantially parallel state. Accordingly, as the substrates 150 and 160 are pressed apart, the contacts 131 and 141 maintain a vertical or substantially vertical alignment with respect to each other until they are fully unmated, as shown in FIG. 4E.

Thus, parallelism between the first and second substrates 150 and 160 is maintained throughout the mating and unmating processes, and the corresponding pairs of top and bottom connectors 130 and 140 can be mated and unmated without zippering. Because zippering is avoided, the problems with zippering are avoided. That is, the connector bodies of the top and bottom connectors 130 and 140 are not damaged, the contacts 131 and 141 of the top and bottom connectors 130 and 140 are not damaged, solder joints (e.g., solder joints that connect the contacts 131 and 141 to the top and bottom substrates 150 and 160) are not fractured, the top and bottom substrates 150 and 160 are not damaged, the hands of the person attempting to mate or unmate the top and bottom substrates 150 and 160 are not injured, traces in the top and bottom substrates 150 and 160 are not cracked, and material from the inner walls of the connector bodies of the top and bottom connectors 130 and 140 is not shaved off.

The recess 116 of the top part 110 is shaped so that a tool, such as an Allen wrench, can be inserted therein to unscrew the top part 110 from the bottom part 120. Thus, because the bottom part 120 is fixed to the bottom substrate 160, the shoulder 111 of the top part 110 presses against the top substrate 150 when the top part 110 is rotated and loosened from the bottom part 120. The recess 116 of the top part 110 may have any drive type. For example, as shown in FIGS. 7A to 7C, the recess 116 may be (a) a hex drive, (b) a Torx/star drive, (c) a Philips drive, etc. Alternatively, the top part 110 may be formed so that a person is able to insert his or her fingers between the top and bottom substrates 150 and 160 to manually unscrew the top part 110 from the bottom part 120.

Although five standoffs 100 are shown in FIG. 2 and two standoffs 100 are shown in FIGS. 4A to 4E, the number of standoffs 100 is not so limited. The top and bottom substrates 150 and 160 may be connected by only a single mated pair of one top part 110 and one bottom part 120, or by any number of top parts 110 and bottom parts 120. Furthermore, although eight pairs of top and bottom connectors 130 and 140 are shown in FIG. 2 and only one pair of top and bottom connectors 130 and 140 is shown in FIGS. 4A to 4E, any number of top connectors 130 and any number of bottom connectors 140 may be included on either of the top substrate 150 and the bottom substrate 160.

Accordingly, even if the top and bottom connectors 130 and 140 have relatively high mating and unmating forces, either individually or in total when multiple pairs of top and bottom connectors 130 and 140 are arranged on the top and bottom substrates 130 and 140, the substrates 150 and 160 can be maintained in a parallel or substantially parallel state. That is, the standoffs 100 are able to maintain the same or substantially the same board-to-board distance between the substrates during mating and unmating, even when the mating and unmating forces are relatively high.

The two-piece design of the standoff 100 allows for easy mating of the top and bottom substrates 150 and 160 when the top part 110 of the standoff 100 is mated to the top substrate 150 by being screwed to the top substrate 150, and for easy unmating of the top and bottom substrates 150 and 160 when the top part 110 of the standoff 100 is unmated from the bottom part 120 of the standoff 100 by being unscrewed from the bottom part 120 of the standoff 100. The top part 110 of the standoff 100 includes an external threading and an internal threading, and the bottom part 120 of the standoff 100 includes an internal threading, as described above, to provide the easy mating and unmating of the top and bottom substrates 150 and 160. Furthermore, while the top and bottom substrates 150 and 160 are mated, the dual-threaded design of the standoff 100 allows the standoff 100 to serve as a standard substrate spacer/securing feature that provides a fixed distance between the top and bottom substrates 150 and 160, while still being able to aid in the mating and unmating of the top and bottom substrates 150 and 160.

Although the threadings in the standoff 100 are shown using a standard threading (i.e., clockwise to tighten), the standoff 100 may instead use a reverse threading. Furthermore, the arrangement of the top part 110 and the bottom part 120 may be reversed, such that the top part 110 includes a female portion and the bottom part 120 includes a male portion that is screwed into the female portion.

As shown in FIGS. 8A to 8E, a standoff according to the preferred embodiments of the present invention can be modified to have any suitable size, including, for example, 7 mm, 11 mm, 14 mm, 16 mm, and 19 mm height. In addition, although the standoff is shown in the drawings to have cylindrical shape, it is possible that the standoff has any suitable shape, including square, hexagon, octagon, irregular shapes, etc. The standoff is preferably made of stainless steel; however, any suitable material could be used, including plastic, steel, brass, titanium, aluminum, etc.

Figure 9:
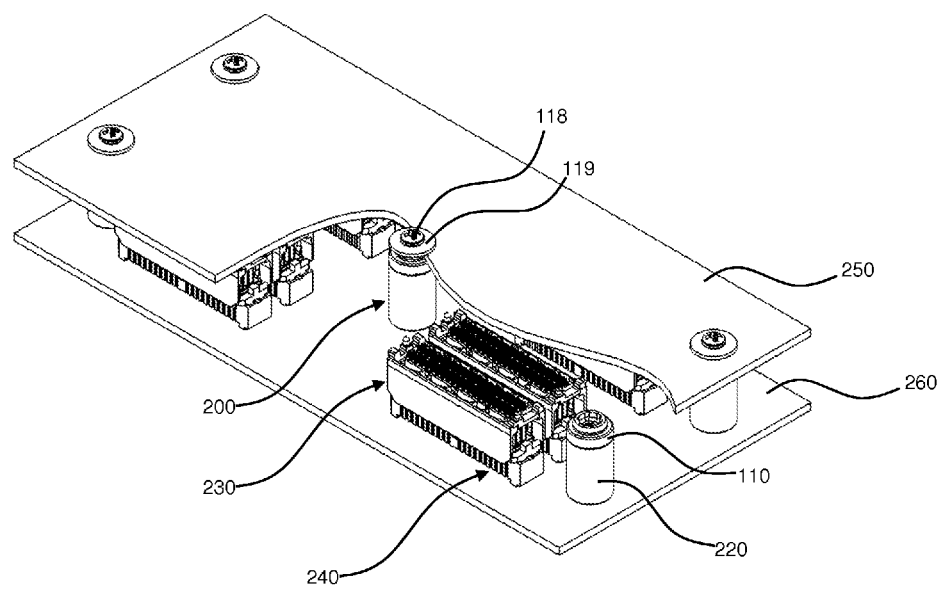
FIG. 9 shows a plurality of the standoffs arranged between two parallel or substantially parallel substrates with corresponding top and bottom connectors according to a second preferred embodiment of the present invention.
Figure 10:
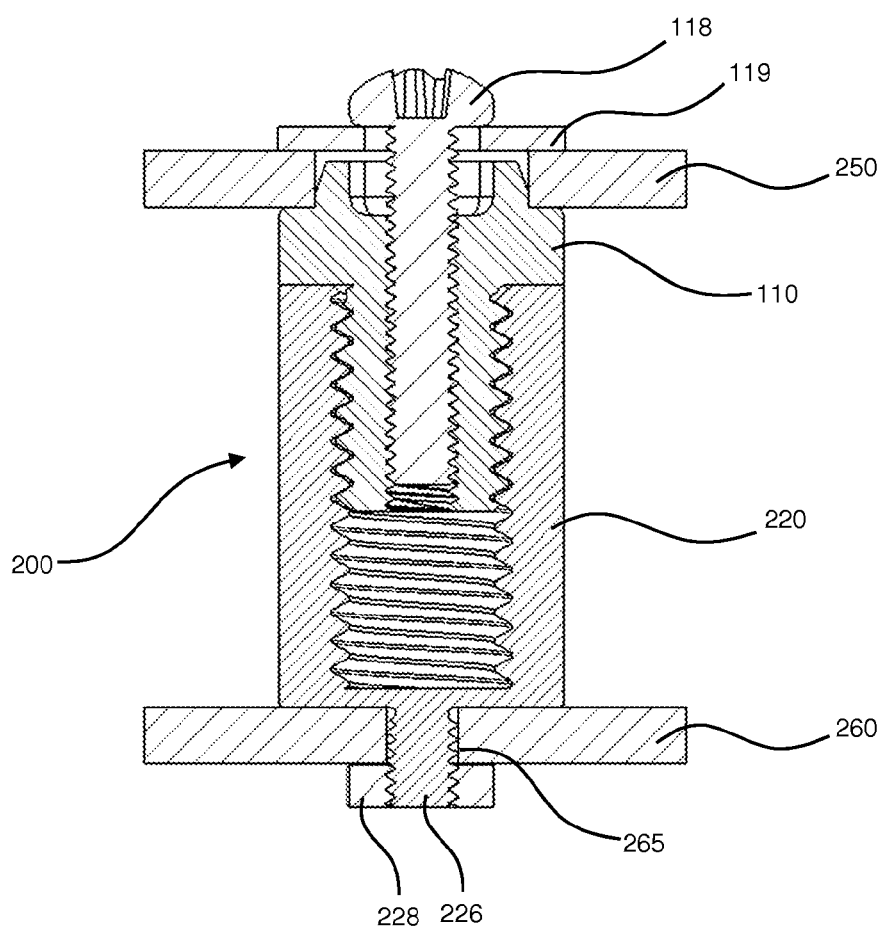
FIG. 10 is close-up sectional view of a standoff of FIG. 9.

FIGS. 9 and 10 show standoffs 200 according to a second preferred embodiment of the present invention in which the top and bottom substrates 250 and 260 with corresponding connectors 230 and 240 are connected in a parallel or substantially parallel manner. One of the differences between the first and second embodiments is that the stack height of the standoffs 100 of the first preferred embodiment shown in FIGS. 1 to 4E is smaller than the stack height of the standoffs 200 of the second preferred embodiment shown in FIGS. 9 and 10, to accommodate the top and bottom connectors 230 and 240 that have taller stack heights than the top and bottom connectors 130 and 140.

Preferably, as shown in FIG. 10, the standoff 200 includes the same top part 110 as the standoff 100 shown in FIGS. 1 to 4E, and the standoff 200 is attached to the top substrate 250 in the same manner that the standoff 100 is attached to the top substrate 150. However, as shown in FIG. 10, the bottom part 220 of the standoff 200 includes an externally-threaded portion 226 that passes through a hole 265 in the bottom substrate 260 and engages with a nut 228 to secure the bottom part 220 to the bottom substrate 260, in contrast to the press-fit arrangement of the knurled portion 126 and the hole 165 in the bottom substrate 160 as shown in FIGS. 1 to 4E.

Figure 11:
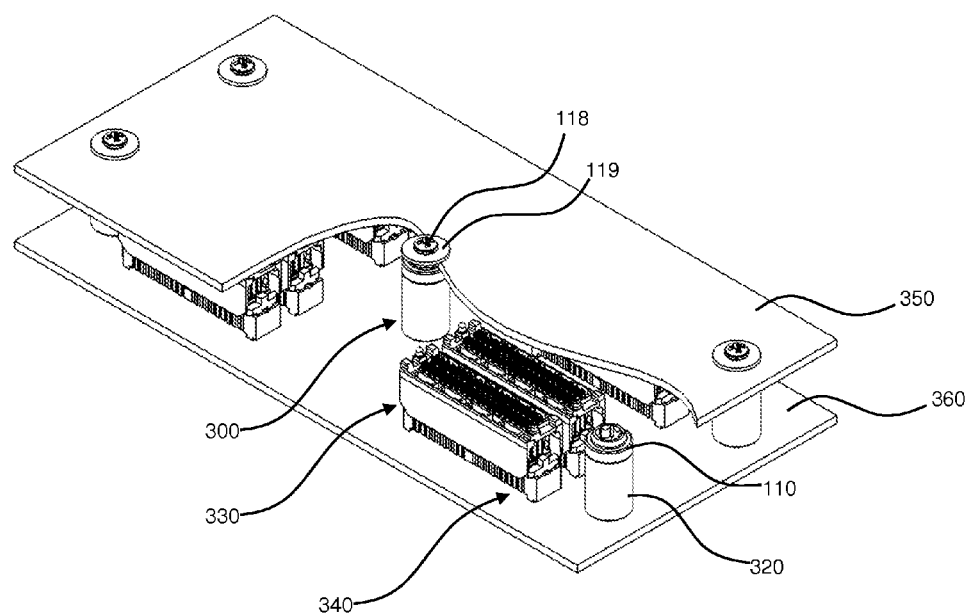
FIG. 11 shows a plurality of the standoffs arranged between two parallel or substantially parallel substrates with corresponding top and bottom connectors according to a third preferred embodiment of the present invention.
Figure 12:
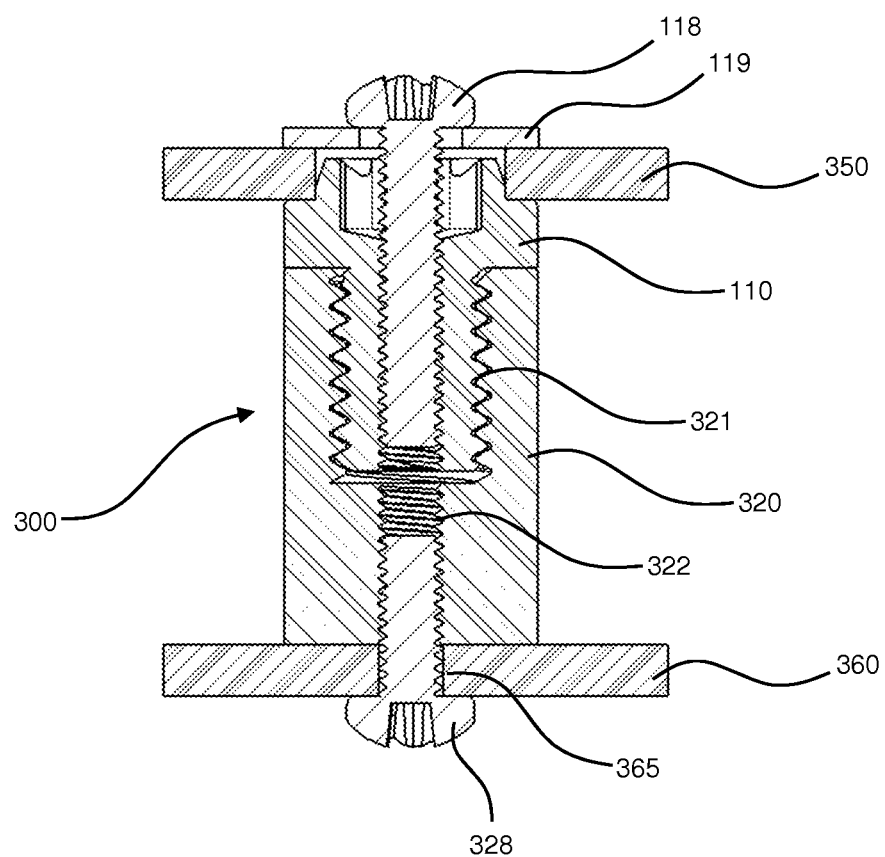
FIG. 12 is close-up sectional view of a standoff of FIG. 11.

FIGS. 11 and 12 show standoffs 300 according to a third preferred embodiment of the present invention in which the top and bottom substrates 350 and 360 with corresponding connectors 330 and 340 are connected in a parallel or substantially parallel manner. One of the differences between the first and third embodiments is that the stack height of the standoffs 100 of the first preferred embodiment shown in FIGS. 1 to 4E is smaller than the stack height of the standoffs 300 of the third preferred embodiment shown in FIGS. 11 and 12, in order to accommodate the top and bottom connectors 330 and 340 that have taller stack heights than the top and bottom connectors 130 and 140.

Preferably, as shown in FIG. 12, the standoff 300 includes the same top part 110 as the standoff 100 shown in FIGS. 1 to 4E, and the standoff 300 is attached to the top substrate 350 in the same manner that the standoff 100 is attached to the top substrate 150. However, as shown in FIG. 12, the bottom part 320 of the standoff 300 includes both an upper internally-threaded portion 321 that engages with the externally threaded portion of the top part 110 and a lower internally-threaded portion 322 that engages with a screw 328 that passes through a hole 365 in the bottom substrate 360 to secure the bottom part 320 to the bottom substrate 360, in contrast to the press-fit arrangement of the knurled portion 126 and the hole 165 in the bottom substrate 160 as shown in FIGS. 1 to 4E.

Figure 13:
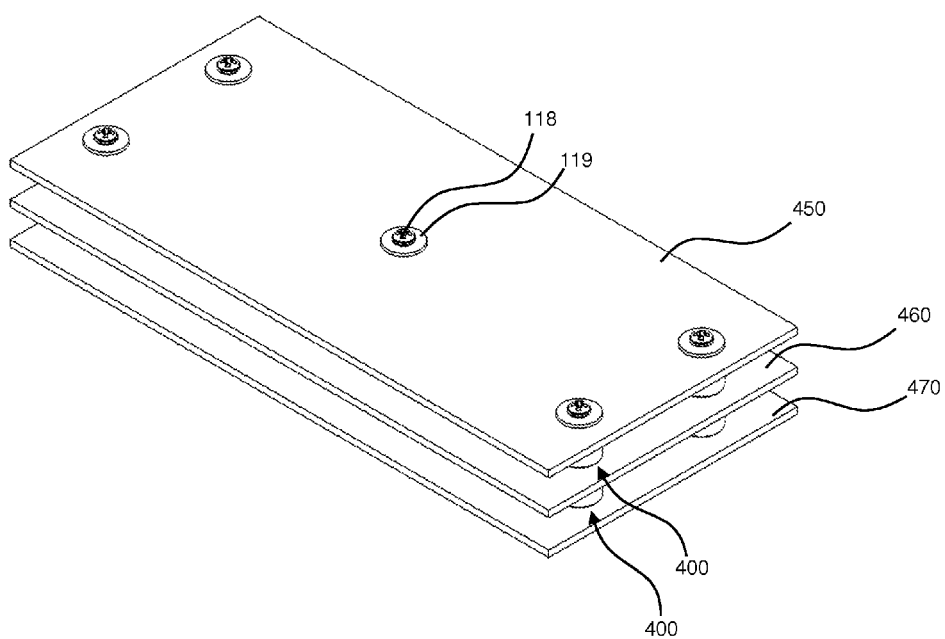
FIG. 13 shows a plurality of the standoffs arranged between three parallel or substantially parallel substrates with corresponding top and bottom connectors according to a fourth preferred embodiment of the present invention.
Figure 14:
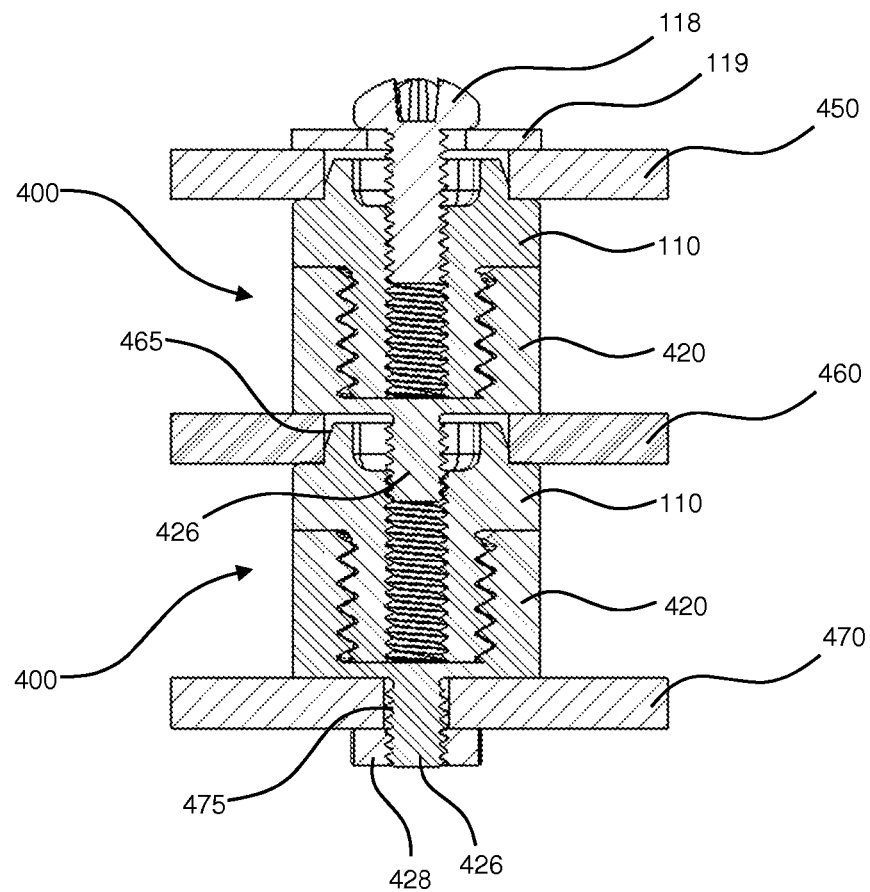
FIG. 14 is close-up sectional view of standoffs of FIG. 13.

FIGS. 13 and 14 show standoffs 400 according to a fourth preferred embodiment of the present invention in which three substrates 450, 460, and 470 are connected in a parallel or substantially parallel manner. Preferably, as shown in FIG. 14, the standoffs 400 include the same top part 110 as the standoff 100 shown in FIGS. 1 to 4E, and the top and bottom parts 110 and 420 of the standoffs 400 connecting the top substrate 410 to the middle substrate 460 are the same as the top and bottom parts 110 and 420 of the standoffs 400 connecting the middle substrate 460 to the bottom substrate 470.

The standoffs 400 arranged between the top substrate 450 and the middle substrate 460 are preferably attached to the top substrate 450 in the same manner that the standoff 100 is attached to the top substrate 150. However, as shown in FIG. 14, the bottom parts 420 of the standoffs 400 include externally-threaded portions 426, which pass through either a hole 465 in the middle substrate 460 or a hole 475 in the lower substrate 470. Accordingly, the externally-threaded portions 426 of the bottom parts 420 can engage with either the internal threading of the top part 110 of another standoff 400 to secure two standoffs 400 to the middle substrate 460, or with a nut 428 to secure one of the standoffs 400 to the bottom substrate 470. In addition, although only three substrates 450, 460, and 470 are shown in FIGS. 13 and 14, it is possible for the standoffs 400 to connect any suitable number of substrates.

Figure 15:
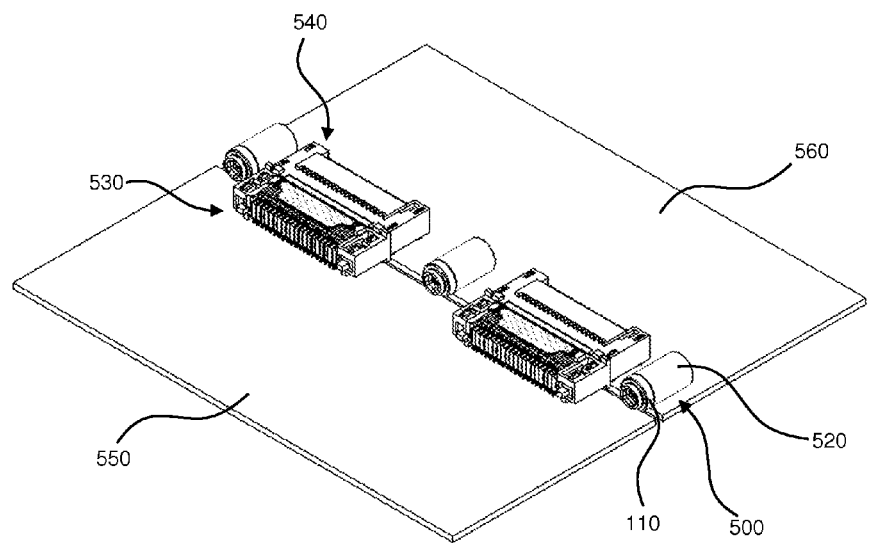
FIG. 15 shows a plurality of the standoffs arranged between two coplanar or substantially coplanar substrates with corresponding top and bottom connectors according to a fifth preferred embodiment of the present invention.
Figure 16:
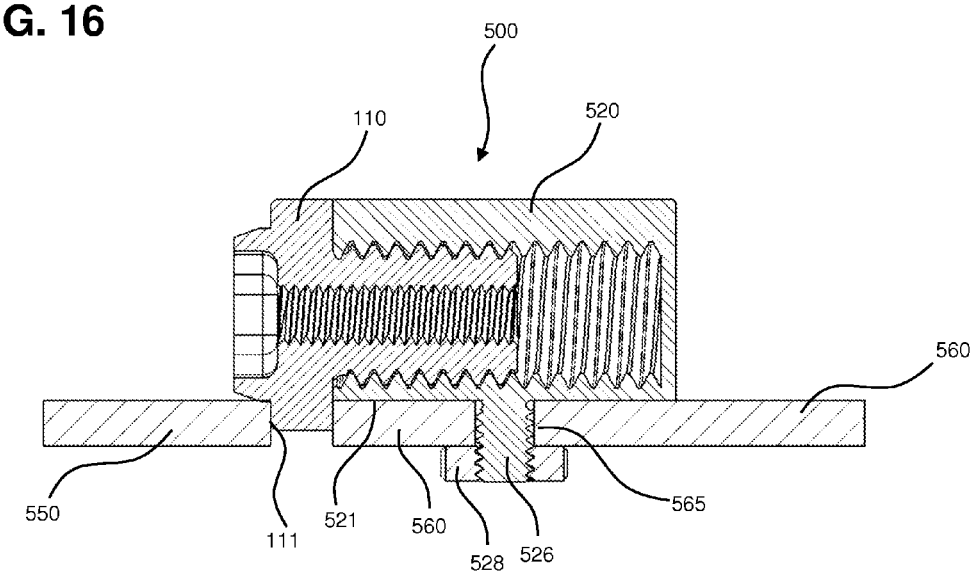
FIG. 16 is close-up sectional view of a standoff of FIG. 15.

FIGS. 15 and 16 show standoffs 500 according to a fifth preferred embodiment of the present invention in which the first and second substrates 550 and 560 with corresponding connectors 530 and 540 are connected in a coplanar or substantially coplanar manner. Preferably, as shown in FIG. 16, the standoffs 500 each include the same top part 110 as the standoff 100 shown in FIGS. 1 to 4E, and the shoulder 111 of each of the standoffs 500 is arranged at an edge of the first substrate 550. However, as shown in FIG. 16, the bottom part 520 of each standoff 500 includes an externally-threaded portion 526 that is perpendicular or substantially perpendicular to the main body of the standoff 500. The externally-threaded portion 526 passes through a hole 565 in the second substrate 560 and engages with a nut 528 to secure the bottom part 520 to the second substrate 560. Accordingly, when the top part 110 of each of the standoffs 500 is incrementally and sequentially unscrewed from its corresponding bottom part 520, the side edges of the substrates 550 and 560 are maintained in a parallel or substantially parallel state while the connectors 530 and 540 are unmated. In addition, although the bottom part 520 of the standoff 500 shown in FIG. 16 includes a recessed portion 521, it is possible for the top and bottom parts 110 and 520 to have the same diameter or shape.

Figure 17:
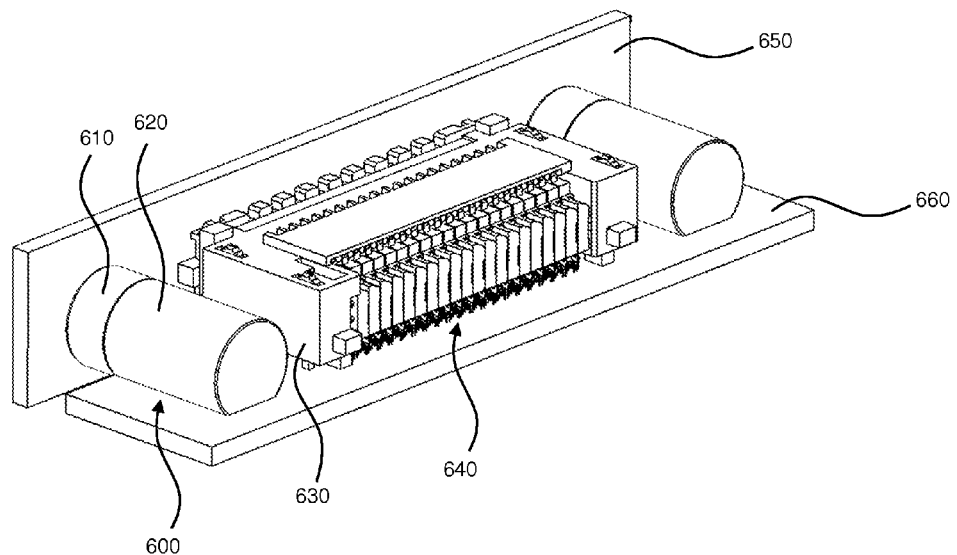
FIG. 17 shows a plurality of the standoffs arranged between two perpendicular or substantially perpendicular substrates with corresponding top and bottom connectors according to a sixth preferred embodiment of the present invention.
Figure 18:
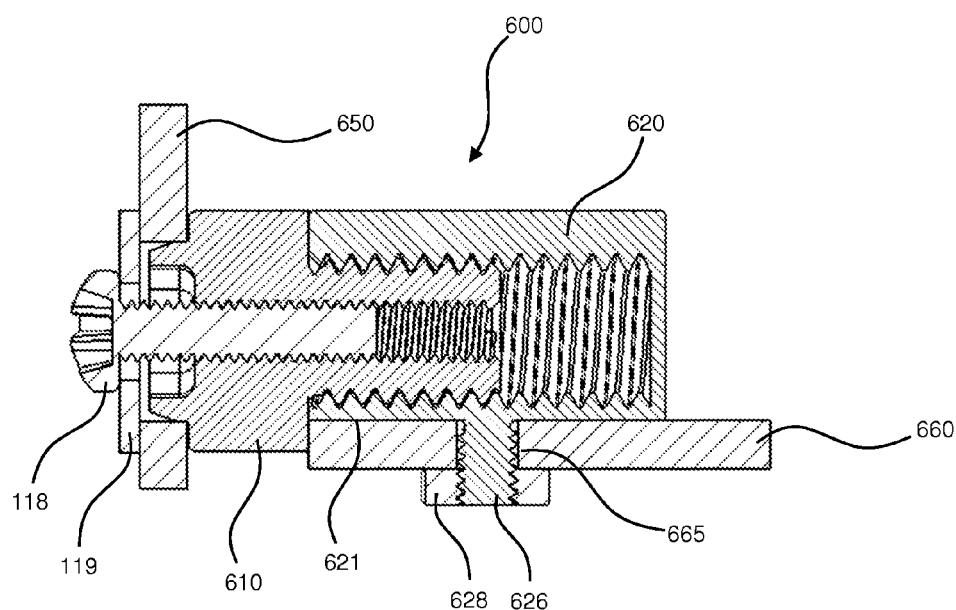
FIG. 18 is close-up sectional view of a standoff of FIG. 17.

FIGS. 17 and 18 show standoffs 600 according to a sixth preferred embodiment of the present invention in which two substrates 650 and 660 with corresponding connectors 630 and 640 are connected in a perpendicular or substantially perpendicular manner. Preferably, as shown in FIG. 18, the top part 610 of each of the standoffs 600 is similar to the top part 110 of each of the standoffs 100, except that there is a greater distance between the shoulder 611 and the external threading of the top part 620 as compared to the distance between the shoulder 111 and the external threading of the top part 120. Preferably, as shown in FIG. 18, the top part 610 of the standoff 600 is attached to the top substrate 650 in the same manner that the top part 110 of the standoff 100 is attached to the top substrate 150.

However, as shown in FIG. 18, the bottom part 620 of each standoff 600 includes an externally-threaded portion 626 that is perpendicular or substantially perpendicular to the main body of the standoff 600. The externally-threaded portion 626 passes through a hole 665 in the bottom substrate 660 and engages with a nut 628 to secure the bottom part 620 to the second substrate 660. In addition, although the bottom part 620 of the standoff 600 shown in FIG. 18 includes a recessed portion 621, it is possible for the top and bottom parts 610 and 620 to have the same diameter or shape.

Figure 19:
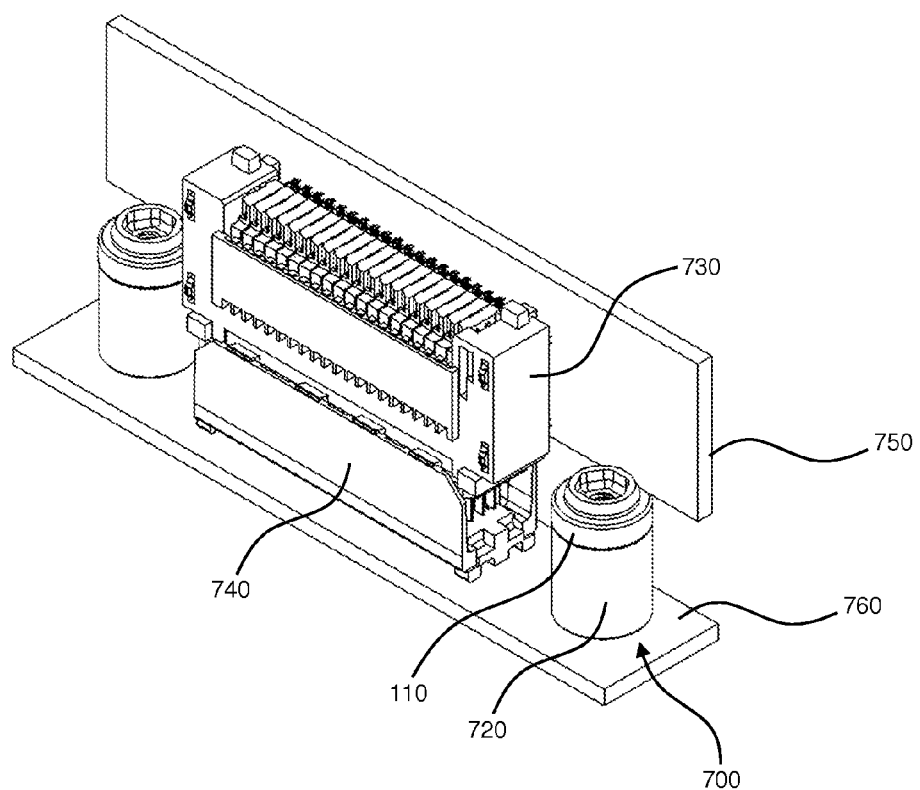
FIG. 19 shows a plurality of the standoffs arranged between two perpendicular or substantially perpendicular substrates with corresponding top and bottom connectors according to a seventh preferred embodiment of the present invention.
Figure 20:
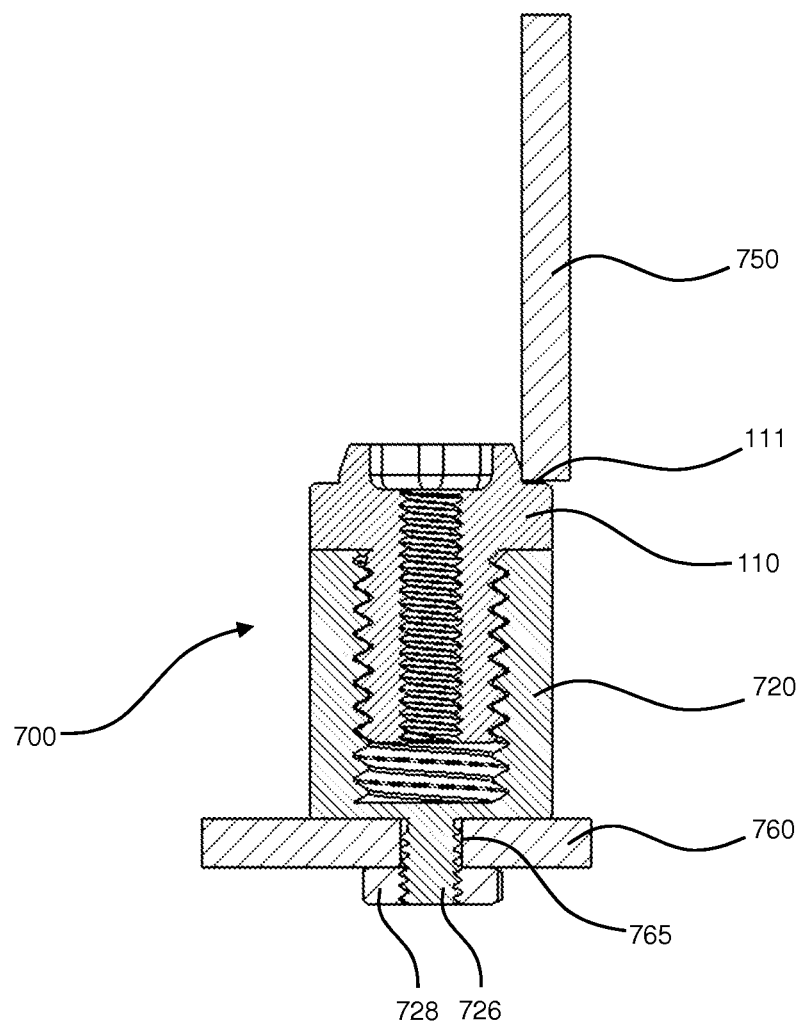
FIG. 20 is close-up sectional view of a standoff of FIG. 19.

FIGS. 19 and 20 show standoffs 700 according to a seventh preferred embodiment of the present invention in which two substrates 750 and 760 with corresponding connectors 730 and 740 are connected in a perpendicular or substantially perpendicular manner. Preferably, as shown in FIG. 20, the standoffs 700 each include the same top part 110 as the standoff 100 shown in FIGS. 1 to 4E, and the shoulder 111 of each of the standoffs 700 is arranged at an edge of the upper substrate 750. However, as shown in FIG. 20, the standoff 700 includes an externally-threaded portion 726 that passes through a hole 765 in the bottom substrate 760 and engages with a nut 728 to secure the bottom part 720 to the bottom substrate 760. Accordingly, when the top part 110 of each of the standoffs 700 is incrementally and sequentially unscrewed from its corresponding bottom part 720, the bottom edge of the substrate 750 and the main surface of the substrate 760 are maintained in a parallel or substantially parallel state while the connectors 730 and 740 are unmated.

Figure 21A:
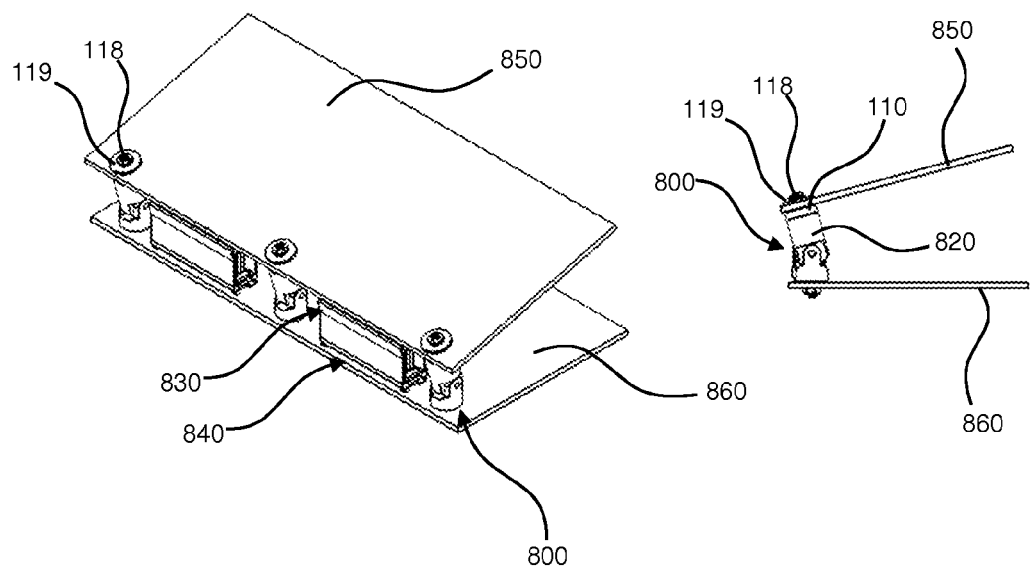
FIGS. 21A and 21B show a plurality of the standoffs arranged between two angled substrates with corresponding top and bottom connectors according to an eighth preferred embodiment of the present invention.
Figure 21B:
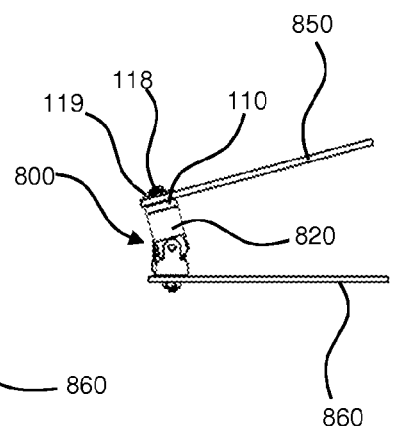
Figure 22:
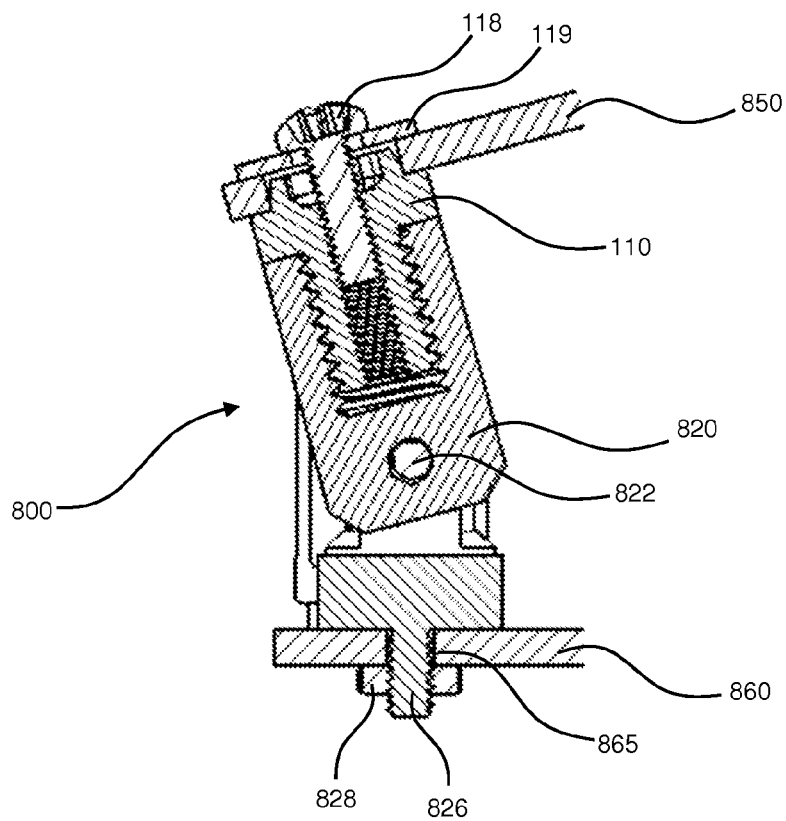
FIG. 22 is close-up sectional view of a standoff of FIG. 21.

FIGS. 21A, 21B, and 22 show standoffs 800 according to an eighth preferred embodiment of the present invention in which two substrates 850 and 860 with corresponding connectors 830 and 840 are connected at an angle. The angle between the substrates 850 and 860 can vary from 0° (parallel) to 90° (perpendicular).

Figure 23:
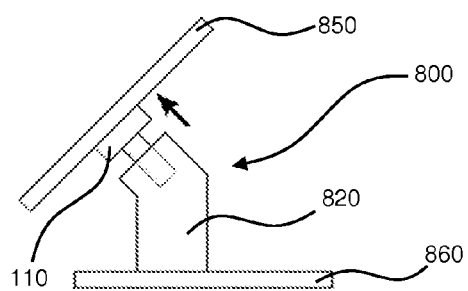
FIG. 23 shows a modification of the eighth preferred embodiment of the present invention.
Figure 24:
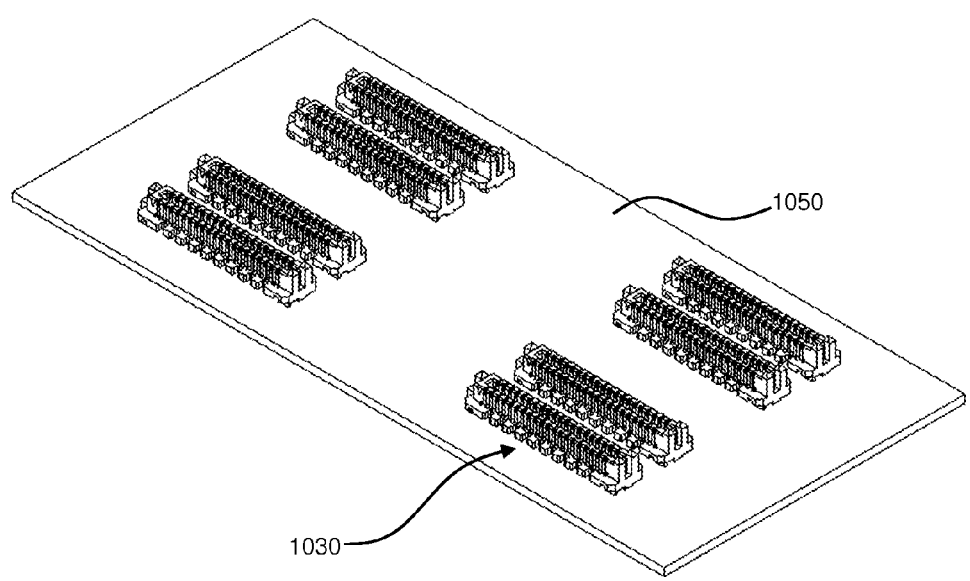
FIGS. 24 and 25 show conventional substrates with male and female connectors.
Figure 25:
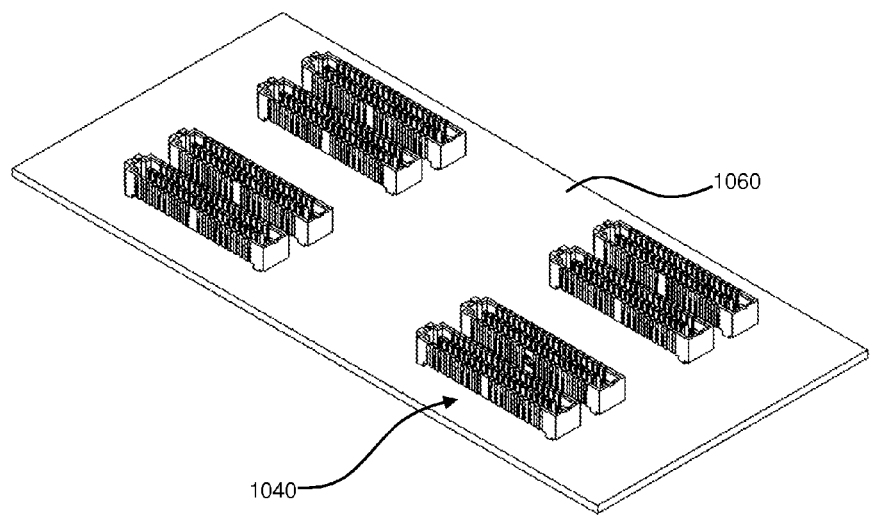
Figure 26:
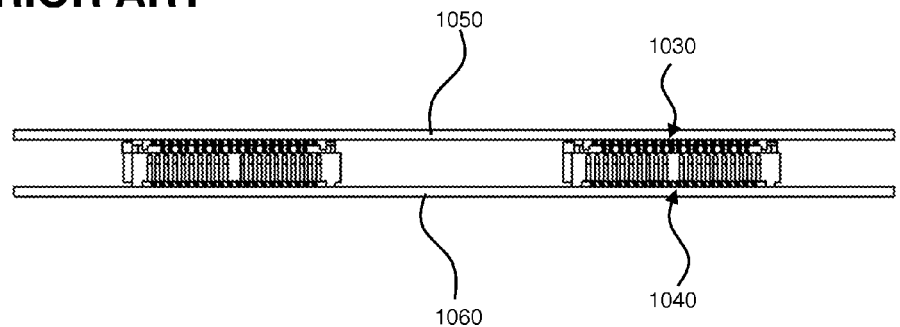
FIGS. 26 and 27 show the conventional substrates of FIGS. 24 and 25 mated with one another.
Figure 27:
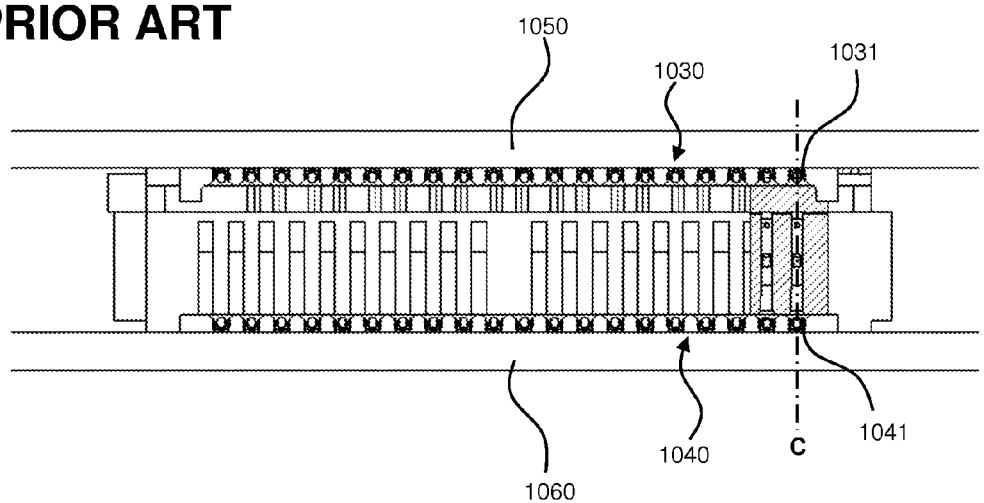
Figure 28:
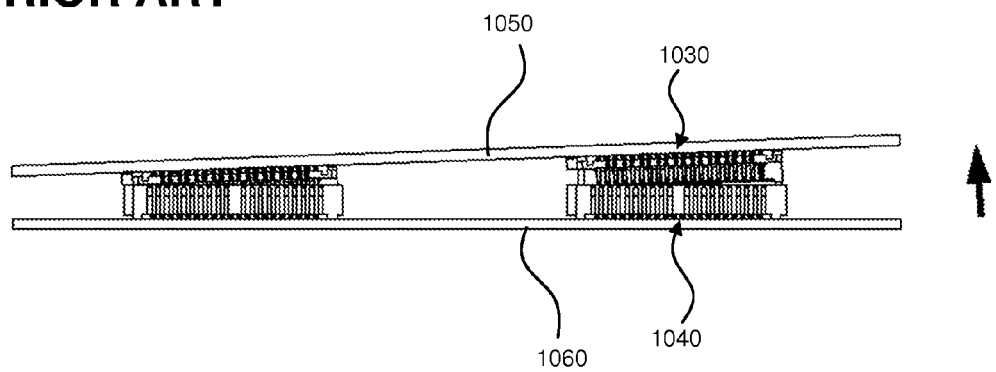
FIG. 28 shows the unmating of the conventional substrates of FIGS. 26 and 27.
Figure 29:
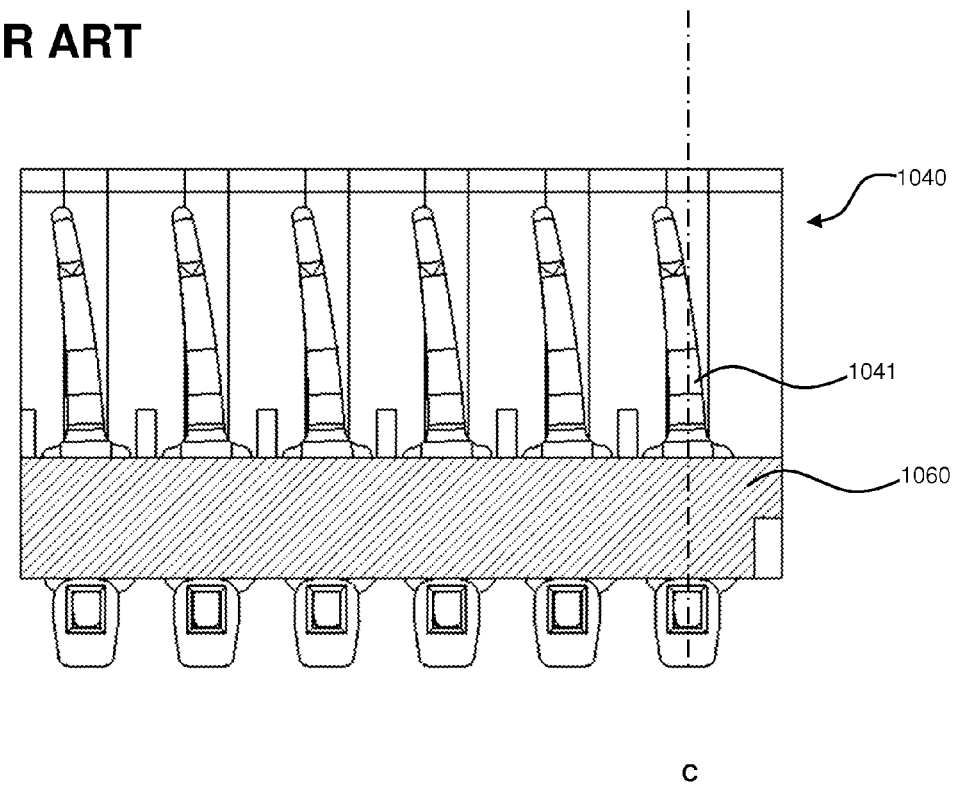
FIG. 29 is close up view of conventional contacts after being repeatedly subjected to the unmating shown in FIG. 28.

Preferably, as shown in FIG. 22, the standoff 800 includes the same top part 110 as the standoff 100 shown in FIGS. 1 to 4E, and the standoff 800 is attached to the top substrate 850 in the same manner that the standoff 100 is attached to the top substrate 150. However, as shown in FIG. 22, the bottom part 820 of the standoff 800 includes an externally-threaded portion 826 that passes through a hole 865 in the bottom substrate 860 and engages with a nut 828 to secure the bottom part 820 to the bottom substrate 860. Further, as also shown in FIG. 22, the bottom part 820 includes a pivot point 822 that permits the connectors 830 and 840 on the substrates 850 and 860 to be connected at various angles. As shown in FIG. 23, the standoff 800 can also be modified so that the top and bottom substrates 850 and 860 are at a fixed angle.

Thus, in addition to the first preferred embodiment of the present invention, the second through eighth preferred embodiments of the present invention are also able to provide mating and/or unmating of corresponding pairs of connectors without zippering.

However, the standoffs described herein with respect to the second through eighth preferred embodiments of the present invention are not limited thereto, and may include other arrangements, such as those described above with respect to the first preferred embodiment of the present invention, including the modifications shown in FIGS. 5A to 8E.

According to the preferred embodiments of the present invention, the bottom part of the standoff may have an open form, for example, the bottom part 110 shown in FIG. 3, or a closed form, for example, the bottom part 520 shown in FIG. 16.

According to the preferred embodiments of the present invention, two or more substrates can be secured together while providing mechanical robustness and aiding in the mating and/or unmating of the substrates. The preferred embodiments of the present invention help maintain adequate electrical connections between the connectors even in unfavorable conditions such as during vibration and in harsh environments. Further, the preferred embodiments of the present invention only require only common hand tools, for example, a screwdriver and/or an Allen wrench to mate and unmate male and female connectors connecting two or more substrates.

The preferred embodiments of the present invention provide an accurate board-to-board distance between substrates, which ensures sufficient contact wipe and a good electrical connection. The preferred embodiments of the present invention can be implemented to provide varying distances between heights, for example, to adapt to the specific connectors mounted on the substrates.

The preferred embodiments of the present invention also allow for the mating and unmating of substrates even when the edges of the substrates are inaccessible or when a small board-to-board distance will not allow for grasping of the substrates.

In most applications for connecting two or more substrates, two or more of the same standoffs are preferably used. However, it is possible to use different standoffs in the same application. For example, different height standoffs might be used in a single application if one or both of the substrates does not have a uniform thickness. It is also possible to use standoffs with different attachment types in the same application. For example, standoffs with knurled portions and standoffs with threaded male portions could be used in the same application.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:

1. A connector system comprising:
   a first substrate;
   a second substrate; and
   a standoff arranged between the first substrate and the second substrate, the standoff including:
      a first part with an external threading; and
      a second part with an internal threading configured to engage with the external threading of the first part;
   wherein
   the first part is configured to engage with the first substrate;
   the second part is configured to engage with the second substrate; and
   the external threading of the first part and the internal threading of the second part are configured such that the first part and the second part are configured to be unscrewed from each other to engage the first and second substrates to cause the distance between the first and second substrates to increase.

2. The connector system according to claim 1, further comprising:
   a screw, wherein;
   the first part includes an internal threading;
   the first substrate includes a hole; and
   the screw extends from an exterior surface of the first substrate and into the hole of the first substrate to engage the internal threading of the first part to secure the standoff to the first substrate.

3. The connector system according to claim 2, wherein a washer is arranged between the head of the screw and the exterior surface of the first substrate.

4. The connector system according to claim 2, wherein a distance between the first and second substrates decreases when the screw is screwed into the internal threading of the first part.

5. The connector system according to claim 1, wherein a height of the standoff increases when the first part and the second part are unscrewed from each other.

6. The connector system according to claim 1, wherein:
   a shoulder portion of the first part is arranged at an interior surface of the first substrate; and
   when the first part and the second part are unscrewed from each other, the shoulder portion presses against the first substrate to increase the distance between the first and second substrates.

7. The connector system according to claim 1, wherein a height of the standoff decreases when the first part is screwed into the second part.

8. The connector system according to claim 1, wherein:
   the second part includes a knurled portion;
   the second substrate includes a hole; and
   the knurled portion of the second part is press-fit into the hole of the second substrate to secure the standoff to the second substrate.

9. The connector system according to claim 1, wherein the second part is soldered to the second substrate to secure the standoff to the second substrate.

10. The connector system according to claim 1, wherein:
    the second part includes an external threading;
    the second substrate includes a hole; and
    the external threading of the second part is arranged to pass through a hole in the second substrate.

11. The connector system according to claim 10, wherein the standoff is secured to the second substrate by attaching a nut to the external threading of the second part.

12. The connector system according to claim 10, wherein the standoff is configured to be secured to the second substrate by engaging the external threading of the second part with an internal threading of a first part of another standoff.

13. The connector system according to claim 1, wherein:
    the second part includes an internal threading;
    the second substrate includes a hole; and
    a screw inserted into the hole of the second substrate engages with the internal threading of the second part to secure the standoff to the second substrate.

14. The connector system according to claim 1, wherein:
    a first electrical connector is arranged on the first substrate;
    a second electrical connector is arranged on the second substrate; and
    when the first and second parts are mated with each other and engaged with the first and second substrates, the first electrical connector is mated with the second electrical connector.

15. The connector system according to claim 1, wherein:
    a first electrical connector is arranged on the first substrate;
    a second electrical connector is arranged on the second substrate; and
    when the first and second parts are unmated from each other, the first electrical connector is unmated from the second electrical connector.

16. The connector system according to claim 1, wherein:
    the first part includes a recess; and
    the recess is arranged to receive a tool to rotate the first part with respect to the second part.

17. The connector system according to claim 16, wherein the recess is arranged to receive one of an Allen wrench, a hex drive, a star drive, and a Philips drive.

18. The connector system according to claim 1, wherein the first and second substrates are parallel or substantially parallel with respect to each other.

19. The connector system according to claim 1, wherein the first and second substrates are perpendicular or substantially perpendicular with respect to each other.

20. The connector system according to claim 1, wherein the first and second substrates are coplanar or substantially coplanar with respect to each other.

21. The connector system according to claim 1, wherein the second part includes a pivot point configured to position the first and second substrates at an oblique angle with respect to each other.

* * * * *